United States Patent [19]

Murata et al.

[11] 4,270,219
[45] May 26, 1981

[54] CHANNEL SELECTION APPARATUS TUNABLE TO DESTINED FREQUENCY IN SHORT TIME

[75] Inventors: Toshinori Murata; Shigeo Matsuura, both of Yokohama, Japan

[73] Assignee: Hitachi, Ltd., Japan

[21] Appl. No.: 951,043

[22] Filed: Oct. 13, 1978

[30] Foreign Application Priority Data

Oct. 14, 1977 [JP] Japan .................. 52-122387
Oct. 21, 1977 [JP] Japan .................. 52-125736

[51] Int. Cl.³ .................................... H04B 1/16
[52] U.S. Cl. .......................... 455/179; 455/161; 455/255
[58] Field of Search ............ 325/464, 465, 466, 468, 325/469, 470, 452, 453, 457, 459; 455/161, 164, 150, 173, 179, 180, 182, 192, 255, 257

[56] References Cited

U.S. PATENT DOCUMENTS

| | | | |
|---|---|---|---|
| 3,822,405 | 7/1974 | Sakamoto | 325/464 |
| 3,846,707 | 11/1974 | Sakamoto et al. | 325/453 |
| 3,913,020 | 10/1975 | Van Anrooy | 325/453 |
| 3,988,681 | 10/1976 | Schurmann | 325/470 |
| 4,004,233 | 1/1977 | Sakamoto | 325/453 |
| 4,031,491 | 6/1977 | Sakamoto | 325/452 |
| 4,063,179 | 12/1977 | Brown | 325/464 |

*Primary Examiner*—Benedict V. Safourek
*Assistant Examiner*—Tommy P. Chin
*Attorney, Agent, or Firm*—Craig and Antonelli

[57] ABSTRACT

A channel selection apparatus comprises a sweep control voltage generator driven by a circuit for sweeping the local oscillation signal frequency in an electronic tuner. The local oscillation signal frequency sweeping circuit includes an arrangement for increasing the rate of sweeping the local oscillation signal frequency only when the latter is being changed not in the vicinity of a destined frequency. The apparatus may further comprise another arrangement for preventing an eventual excessive sweeping beyond the destined frequency.

12 Claims, 19 Drawing Figures

CHANNEL SELECTION APPARATUS TUNABLE TO DESTINED FREQUENCY IN SHORT TIME

The present invention relates to a channel selection apparatus of an electric tuning type used for a television receiver or an FM tuner, and more particularly to such a channel selection apparatus employing a comb filter.

Recently, in place of a channel selection apparatus which directly switches a tuning frequency of a tuning circuit using a variable capacitor or a selection switch, a so-called electronic tuning type channel selection apparatus which uses a tuning circuit including a varactor and a voltage controlled oscillator, to which tuning circuit a D.C. tuning voltage is applied has been frequently used. However, in a system in which one of the preset D.C. tuning voltages is applied through the channel selection switch, it is often necessary to adjust the preset D.C. voltages to attain exact tuning as the characteristics of the varactor or the voltage controlled oscillator change.

Thus, in place of the channel selection apparatus in which one of the preset D.C. voltages is selected through the channel selection switch, a channel selection apparatus has been developed in which automatic tuning is effected each time a channel is switched to always establish a proper D.C. tuning voltage. As an example thereof, reference is made to Japanese Patent Application Laid-Open No. 10707/76 corresponding to Japanese Patent Application entitled "Electronic Tuning Device", filed in the name of The Magnavox Co. and laid open on Jan. 28, 1976 (corresponding to U.S. Pat. application Ser. No. 476,502 filed on June 5, 1974, now abandoned).

The inventors of the present invention have invented an electronic tuning type channel selection apparatus employing a comb filter, which is disclosed in the co-pending U.S. Pat. application Ser. No. 936,923, corresponding to Japanese Patent Application No. 101750/77 filed on Aug. 26, 1977.

It is an object of the present invention to provide a channel selection apparatus tunable in a short time.

It is another object of the present invention to provide a channel selection apparatus which is tunable in a short time and minimizes excess sweeping.

According to the present invention, there is provided a channel selection apparatus comprising: an electronic tuner including a local oscillator; means for sweeping the frequency of the local oscillation signal from the oscillator, the local oscillation signal frequency sweeping means including means for increasing the rate of sweeping the local oscillation signal frequency in comparison with a state in which the local oscillation signal frequency is being charged in the vicinity of a destined frequency while said local oscillation signal is being changed not in the vicinity of the frequency, and means for producing a sweep control signal in response to the output of the means for increasing the rate of sweeping the local oscillation signal frequency, the sweep control signal being fed to the electronic tuner; a comb filter for receiving the local oscillation signal and passing only those frequency components which lie within selected equispaced frequency ranges, the characteristic of said comb filter being such that a frequency band of a broadcast station corresponds to one of the equi-spaced frequency ranges; means for detecting the output of the comb filter and producing at least one pulse in response thereto; and a preset down counter for counting the at least one pulse from the detecting means and producing an up-count completion signal when a preset count for the preset counter is reached.

In order that the invention may be readily carried into effect, it will now be described in detail, by way of example, with reference to the accompanying drawings, in which.

Referring first to FIGS. 1 to 6, the channel selection apparatus disclosed in the above-mentioned copending U.S. application is explained.

Figure 1:
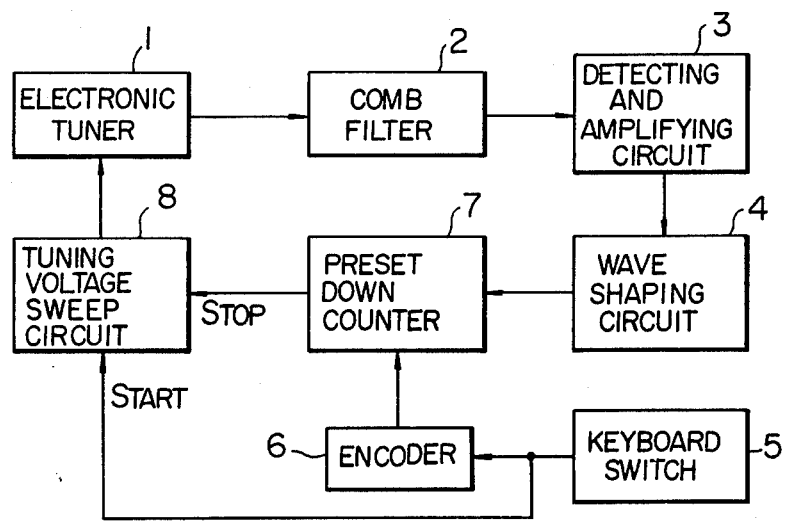
FIG. 1 is a block diagram of the channel selection apparatus disclosed in the above-mentioned co-pending U.S. application by the same inventors.
Figure 3:
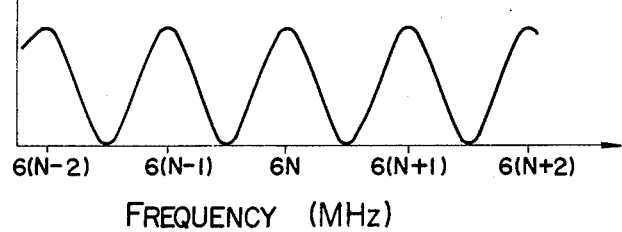
FIG. 3 shows a characteristic of the comb filter of FIG. 2.

In FIG. 1, the channel selection apparatus may comprise an electronic tuner 1 including a voltage controlled local oscillator, a comb filter 2 for receiving a local oscillation signal output from the tuner 1 to produce an output in accordance with a frequency characteristic shown in FIG. 3, a circuit 3 for detecting the output of the comb filter 2 and amplifying the detected output to a necessary level, a wave shaping circuit 4 for converting the output of the detecting and amplifying circuit 3 to a pulse signal, a channel selecting keyboard switch 5 for entering a channel number of a channel to be selected, an encoder 6 for binary-encoding the channel number entered from the switch 5, a preset down counter 7 having the binary coded channel number from the encoder 6 preset therein for downcounting the pulses from the wave shaping circuit 4 starting from the preset number, and a tuning voltage sweep circuit 8 responsive to the actuation of the keyboard switch 5 and the selection of the channel number to supply a voltage sweep control signal to the tuner 1 and also responsive to a count completion signal from the counter 7 to stop the supply of the control signal.

When the keyboard switch 5 is actuated to select the channel number of a desired channel, the channel number is binary-coded by the encoder 6 and the binary coded channel number is stored in the preset down counter 7. At the same time, a start signal from the keyboard switch 5 initiates the sweep operation of the tuning voltage sweeping circuit 8.

As a result, the frequency of the local oscillator in the electronic tuner 1 starts to change from a given initial frequency so that in the tuner 1 the tuning frequency is changed from one end toward the other end of a receiving frequency band within which all of the channels to be received lie. In this manner, the channel selection operation starts. At this time, the local oscillation signal from the local oscillator in the tuner 1 is supplied to the comb filter 2, which may be constructed by a surface acoustic wave element (hereafter, referred to as a SAW element for simplicity) shown in FIG. 2. This element is a modification of that shown in the above-mentioned copending U.S. application.

Figure 2:
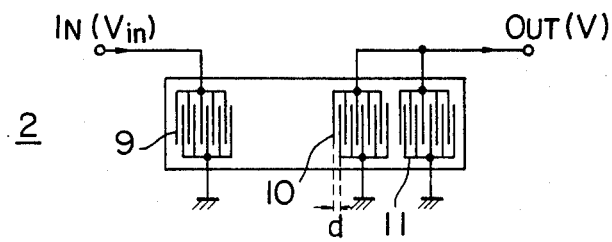
FIG. 2 shows a schematic structure of a surface acoustic wave element used in a comb filter of the channel selection apparatus of FIG. 1.

In FIG. 2, the incoming local oscillation signal is converted to a surface acoustic wave at an input electrode 9 and the surface acoustic wave propagates to a pair of output electrodes 10 and 11, at which the surface acoustic wave is re-converted to an electrical signal. Since the signal re-converted at the electrode 11 has a longer propagation time than the signal re-converted at the electrode 10, the former has a time delay $\tau$ with respect to the latter. Thus, when the signal re-converted at the electrode 10 is expressed by $Ae^{j\omega t}$ (where $\omega = 2\pi f$ and f is a frequency), the signal at the electrode 11 is given by $Ae^{j\omega(t-\tau)}$. Since the electrodes 10 and 11 are interconnected, an output voltage V at an output end of the SAW element 2 is given by:

$$V = A\{e^{j\omega t} + e^{j\omega(t-\tau)}\} \quad (1)$$

When it is amplitude-detected and amplified by the detecting and amplifying circuit 3, it produces an output signal of;

$$V_o = G |V| \quad (2)$$
$$= GA \sqrt{2(1 + \cos \omega \tau)}$$

where G represents the gain of the circuit 3. Accordingly, the output signal $V_o$ is maximum when $$f = N/\tau \quad (3)$$

where N is an integer. The frequency interval $\Delta f$ between the maxima is equal to $1/\tau$. In a television system, the broadcast stations usually exist for every 6 MHz in the local oscillation frequency. Accordingly, by selecting $\tau$ to be equal to 1/6 microsecond, the output signal assumes a maximum for every 6 MHz. Since the SAW element 2 itself has a bandpass characteristic having a center frequency of v/2d where d is a distance between finger electrodes and v is a velocity of SAW signal, the output voltage $V_o$ exhibits a frequency characteristic as represented in decibel in FIG. 3, in which each peak corresponds to different one of the channels. (The illustrated characteristic has been idealized so that the peaks in the characteristic curve of the SAW element have the same level.) Accordingly, when the local oscillation frequency is swept and the number of pulses fed from the wave shaping circuit 4 is counted, the number of broadcast stations swept can be indicated or recognized. Therefore, the output of the wave shaping circuit 4 is supplied to the counter 7, which down-counts the output pulses from the wave shaping circuit 4 starting from the initial channel number having been entered from the keyboard switch 5, and when it completes counting, it produces a count completion signal, which is supplied to the tuning voltage sweep circuit 8 to stop the sweep operation. As a result, the local oscillation frequency of the electronic tuner 1 is maintained at the desired frequency and the channel selection operation completes.

Thus, in the illustrated channel selection apparatus, the tuning voltage for the electronic tuner is not preset but it is always automatically set to establish a frequency of the local oscillator necessary to receive the desired channel. Accordingly, exact channel selection can be effected without adjustment.

Figure 4:
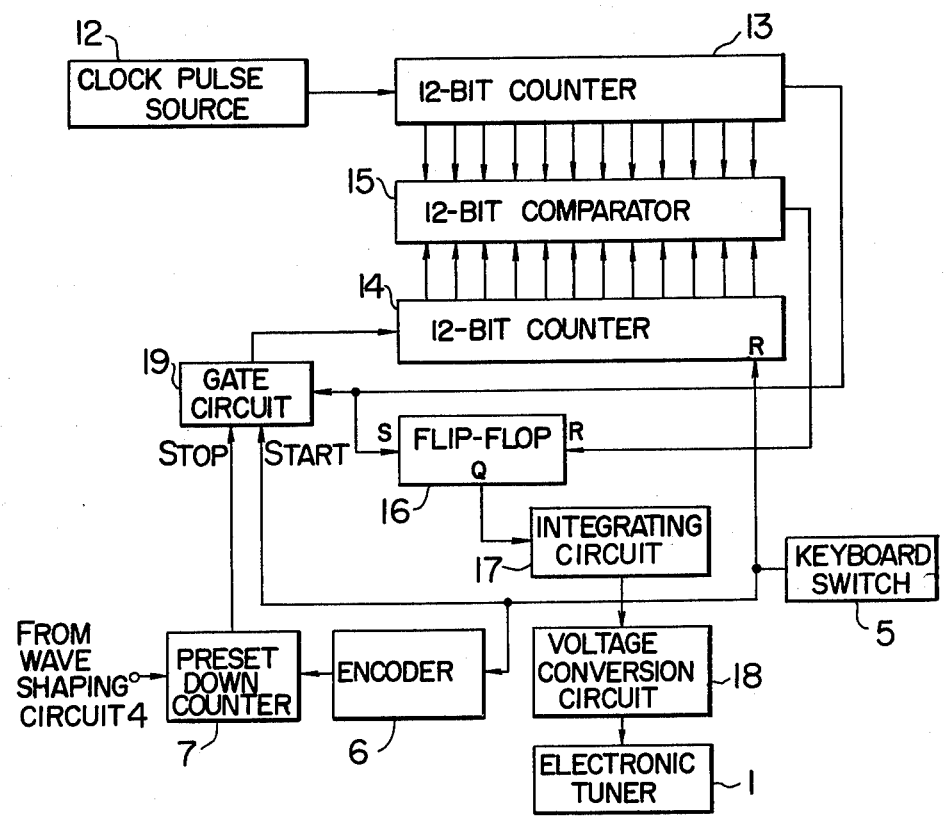
FIG. 4 is a block diagram of a tuning voltage sweep circuit in FIG. 1, which has been designed by the same inventors.

In such a channel selection apparatus, since the precision of the tuning voltage sweep circuit 8 has a significant influence on the precision of channel tuning, a circuit as shown in FIG. 4 which uses a digital technique has been proposed as the circuit 8 by the inventors of the present invention.

In FIG. 4, the tuning voltage sweep circuit 8 which sweeps the local oscillation signal frequency comprises a clock pulse source 12, a first 12-bit counter 13 for counting pulses from the source 12 to produce a carry signal when it overflows, a gate circuit 19, a second 12-bit counter 14 for receiving a pulse signal corresponding to the carry signal from the first counter through the gate circuit 19, a 12-bit comparator 15 for comparing the content of the first counter 13 with the content of the second counter 14 to produce an identity signal when they are identical, an RS flip-flop circuit 16 adapted to be set by a carry signal from the first counter 13 and reset by an identity signal from the comparator 15, an integrating circuit 17 for receiving a square wave output from the flip-flop circuit 16 and converting it to an analog signal, and a voltage conversion circuit 18 for converting the output from the integrating circuit 17 to a signal having a desired amplitude (voltage signal). The gate circuit 19 is open to pass one or more carry signals from the first counter 13 to the second counter 14 from the time of the actuation of the keyboard switch 5 to the time of the reproduction of a counter completion signal by the preset down counter 7, and when a count completion signal is received from the counter 7, the gate circuit 19 blocks supply of any carry signal to the second counter 14. The integrating circuit 17 and the voltage conversion circuit 18 constitute a sweep control voltage producing means.

Figure 5:
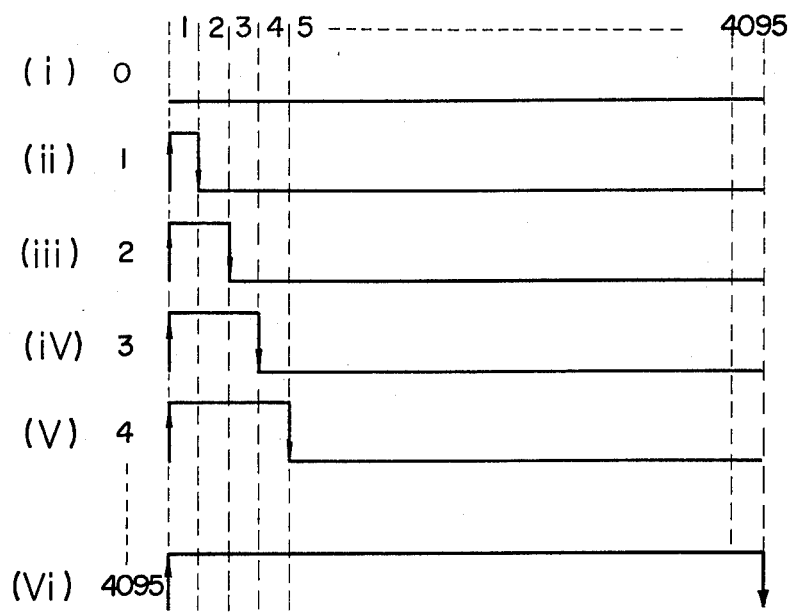
FIGS. 5 and 6 show charts useful to explain the operation of the channel selection apparatus including the tuning voltage sweep circuit of FIG. 4.

Referring to FIG. 5, the operation of the channel selection apparatus including the circuit of FIG. 4 is explained. In FIG. 5, the numerals in the top line, i.e. 1, 2, . . . 4095 represent the content (count) of the first 12-bit counter 13, and the numerals in the left column represent the content (count) of the second 12-bit counter 14.

When the channel number is entered by the keyboard switch 5, the first counter 14 is reset to the count 0, and at the same time the gate circuit 19 is opened to transfer the carry signal from the first counter 13 to the second counter 14.

The first counter 13 counts the pulses from the clock pulse source 12 and when it counts from count 0 to count 4095 it completes one cycle of operation, and when an additional pulse is received all of the bits thereof are reset to zero and a carry signal is produced. At the start of the first cycle, since the second counter 14 has just been reset, the count thereof is zero. On the other hand the count of the first counter 13 is also zero at this time. Therefore, the comparator 15 produces an identity signal which resets the RS flip-flop circuit 16. Therefore, the state of the flip-flop circuit 16 remains unchanged until the first cycle is completed. Accordingly, it produces an output as shown in FIG. 5(i).

When the first counter 13 completes the first counting cycle, the count thereof is reset to zero as described above and at the same time it produces the carry signal which sets the RS flip-flop circuit 16 and causes the second counter 14 to assume the count 1.

Thus, in the second cycle, when the count of the first counter 13 reaches one (1), the comparator 15 produces an identity signal, which resets the RS flip-flop circuit 16. The above condition is shown in FIG. 5(ii).

Similarly, in the subsequent cycles, each time the count of the first counter 13 assumes zero, the RS flip-flop circuit 16 is set and the count of the second counter 14 is incremented one at a time and the RS flip-flop circuit 16 then is reset. Thus, the count of the first counter 13 at which the RS flip-flop circuit 16 is reset increments one by one. Thus, the operation proceeds from the waveform shown in FIG. 5(iii) to that shown in FIG. 5(vi) and the Q-output of the RS flip-flop circuit 16 sequentially produces wider square wave pulses.

Figure 6:
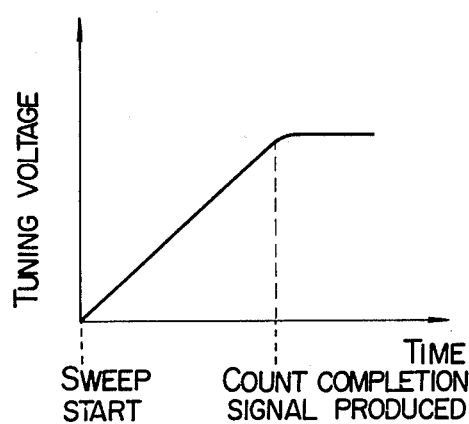

The Q-output is then converted to an analog signal by the integrating circuit 17 and the integrated signal is then converted to a voltage signal by the voltage conversion circuit 18 to produce a sweep control signal which linearly rises with time from zero voltage at the start of sweep, as shown in FIG. 6. This control signal is applied to the electronic tuner as the tuning voltage therefor, and when it is tuned to the desired channel, the preset counter 7 produces a count completion signal. Then, the gate circuit 19 is closed thereby so that the count of the second counter 14 is no longer changed thereafter and the count is maintained. Therefore, the Q-output of the RS flip-flop circuit 16 repetitively produces a constant width square wave. Accordingly, the tuning voltage is maintained at a constant voltage so that the electronic tuner 1 is kept tuned to the selected channel. In this manner, the channel selection operation is completed.

In such a tuning voltage sweep circuit, in order to exactly maintain the tuning voltage to further improve the frequency precision of the local oscillator, it is sufficient to increase the numbers of bits of the first and second counters 13 and 14 and the comparator 15. Therefore, the precision can be more rapidly improved than when analog technique is used. On the other hand, the circuit configuration becomes more complex and hence the implementation by IC technology is necessary. From the viewpoint of power dissipation, the MOS IC technology must be used in many applications. On the other hand, the upper limit of the clock frequency which assures a stable operation is presently considered to be approximately 2 MHz. Therefore, when the 12-bit counters are used like in the abovementioned example and a high frequency channel is to be selected, a maximum time required for the channel selection is equal to:

$$(2^{12} \times 2^{12}) \times \frac{1}{2 \times 10^6} = 8 \text{ seconds}$$

Figure 7:
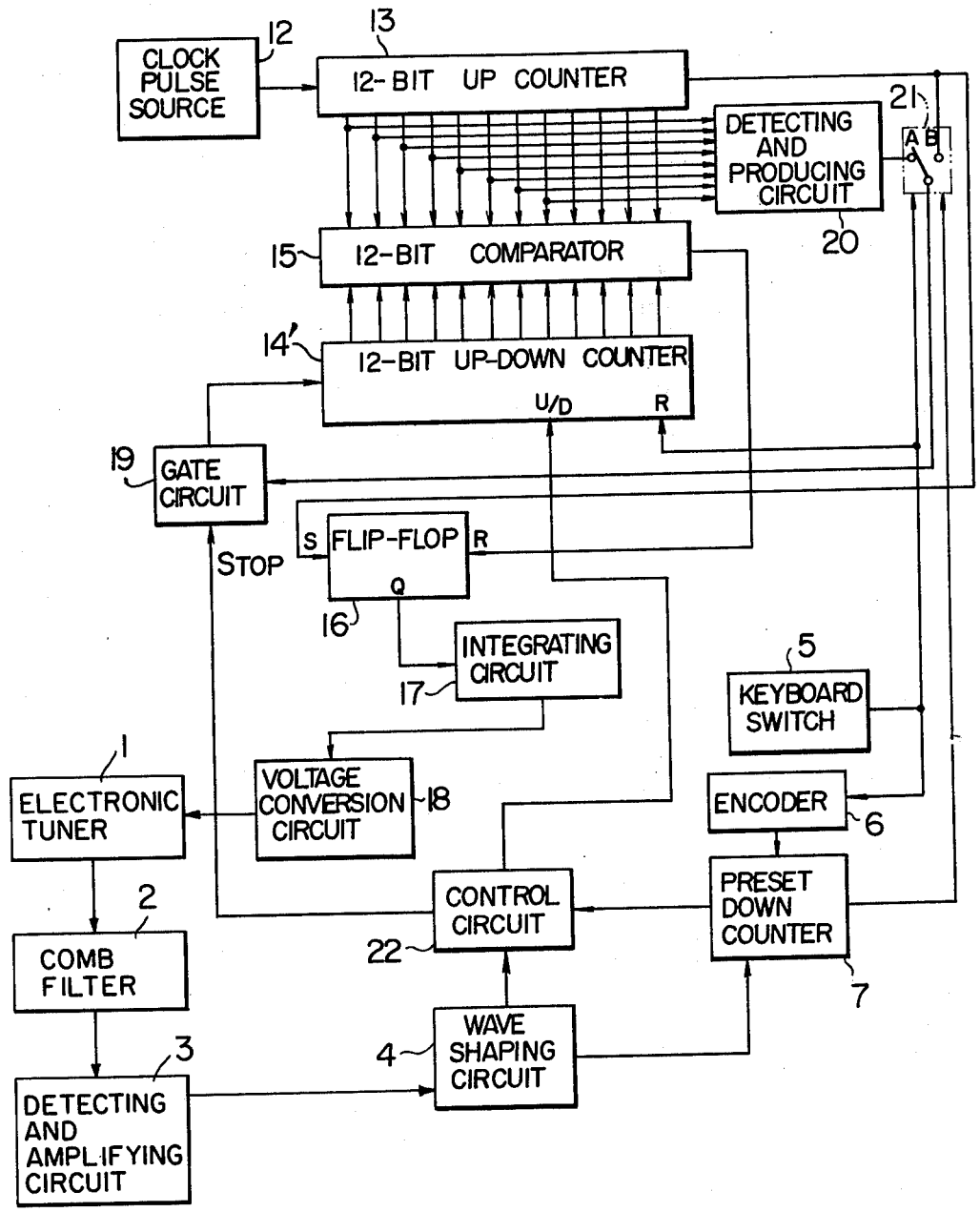
FIG. 7 is a block diagram showing one embodiment of the present invention.
Figure 8:
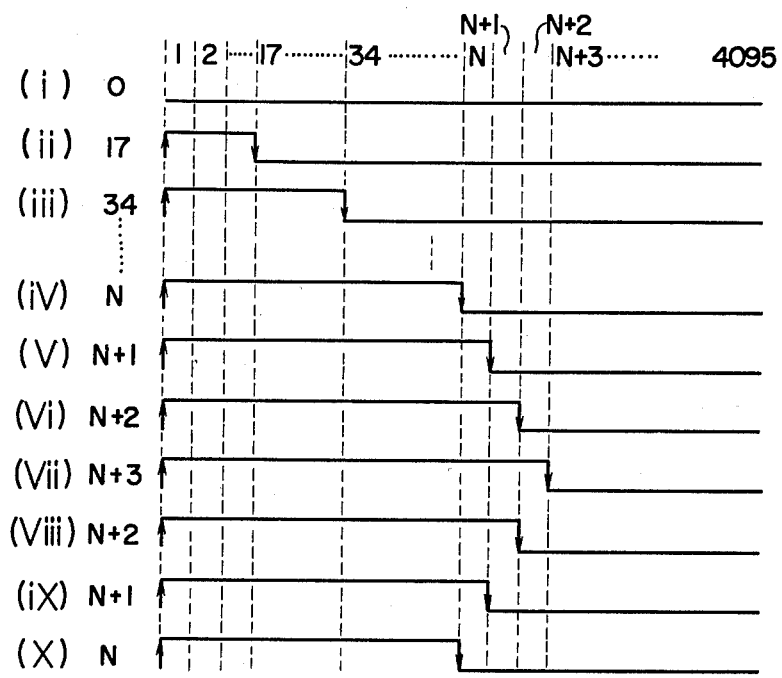
FIGS. 8 and 9 show charts useful to explain the operation of the channel selection apparatus of FIG. 7.

Referring to FIGS. 7 and 8, one embodiment of the present invention will now be explained. In FIG. 7, like numerals and symbols to those shown in FIG. 4 represent like parts or components.

In the present invention, the channel selection apparatus comprises an electronic tuner 1 including a local oscillator as shown in FIG. 1, a comb filter 2 as shown in FIG. 1 which receives the local oscillation output from the tuner 1 to produce the output in accordance with the frequency characteristic as shown in FIG. 3, a circuit 3 as shown in FIG. 1 which detects the output of the comb filter 2 and amplifies the detected signal to a required level, a wave shaping circuit 4 for converting the output from the circuit 3 to a pulse signal, a preset down counter 7 having a count corresponding to a desired channel number preset therein and adapted to down-count pulses from the wave shaping circuit 4 starting from the initial preset count for producing a count completion signal when the count reaches zero, and local oscillation signal frequency sweeping means (corresponding to the tuning voltage sweep circuit 8 in FIG. 8) which includes the blocks 12 to 22.

A second counter 14' is a 12-bit up-down counter which is reset by the actuation of the keyboard switch 5. Numeral 20 denotes a circuit which detects the fact that eight succeeding bits taken from the least significant bit of the first counter 13 are all in binary "0" state and produces a pulse each time it detects such fact. The pulse output from the circuit 20 is supplied to the gate circuit 19 through a switching circuit 21. When a first switch control signal is applied to the switching circuit 21 by entering a desired channel number through the keyboard switch 5, a movable contact makes contact with a fixed contact A and the output of the circuit 20 is supplied to the second counter 14' through the gate circuit 19. When a second switch control signal derived from a count completion signal from the preset counter 7 is applied to the switching circuit 21, the movable contact thereof makes contact with a fixed contact B so that the carry signal from the first counter is transferred to the second counter 14' through the gate circuit 19 and to the flip-flop circuit 16. Numeral 22 denotes a control circuit which is enabled by a count completion signal from the preset counter 7 and switches the second counter 14' into a down-counting operation mode in response to the pulse, first produced after the production of the count completion signal, from the wave shaping circuit 4 and closes the gate circuit 19 in response to the next pulse. The control circuit 22 may be a 2-bit counter.

The operation of the circuit of FIG. 7 is now explained.

When the keyboard switch 5 is actuated to enter the desired channel number to be selected, a first switch control signal from the keyboard switch 5 causes the switching circuit 21 to be thrown to the contact A and resets the second counter 14'. The gate circuit 19 is opened at this time. The first counter 13 thus counts the pulses from the clock pulse source 12. When it completes one cycle of count from count 0 to count 4095 ($=2^{12}-1$) and receives an additional input pulse, all of the bits at 12 bit terminals become zero and a carry signal is produced. At the start of the first cycle, since the second counter 14' has been reset at this time, the comparator 15 produces an identity signal when the content of the first counter 13 is zero. The RS flip-flop circuit 16 is thus reset by the identity signal.

Accordingly, the Q-output of the RS flip-flop circuit 16 is at logical zero level during the first cycle period. This condition is shown in FIG. 8(i). In FIG. 8, like in FIG. 5, the numerals in the top line, i.e. 1, . . . 18, . . . N, . . . 4095 represent the content (count) of the first 12-bit counter, where N represents the channel number entered, and the numerals in the left column represents the content (count) of the second counter 14'.

When the first counter 13 completes the first counting cycle and receives the first pulse in the second cycle, all of the bits at the 12 bit terminals become zero and a carry signal is produced. As a result, the RS flip-flop circuit 16 is set. The operation so far is similar to that in FIG. 5. By this time point, however, the content of the lower 8 bits (meaning the least significant 8 bits) of the first counter 13 has been reset to zero 16 times and the detecting and producing circuit 20 has produced 16 pulses by the end of the first cycle. When the first pulse in the second cycle is received, the first counter 13 overflows and the circuit 20 produces an additional pulse. As a result, the second counter 14' receives the seventeenth pulse to produce the count 17. Therefore, in the second cycle, when the count of the first counter 13 reaches the count 17, the comparator 15 produces an identity signal and the RS flip-flop circuit 16 is reset. Thereafter, the circuit 16 is maintained at 0 state during the remaining second cycle period. The flip-flop circuit 16 thus produces the output signal as shown in FIG. 8(ii) in the second cycle.

Similarly, in the following cycles, each time the count of the first counter 13 is reset to zero, the RS flip-flop circuit 16 is set and the 17 pulses from the detecting and producing circuit 20 are applied to the second counter 14', and each time the content thereof reaches 34, 51, 68, . . . , the RS flip-flop circuit 16 is reset to produce a square wave signal of a sequentially increasing width for each cycle of the first counter 13, as shown in FIG. 8(iii) . . . (iv). The square wave signal of a significantly varying width from the circuit 16 is supplied to the electronic tuner 1 through the integrating circuit 17 and the voltage conversions circuit 18 which constitutes the sweep control signal producing means. Accordingly, the electronic tuner 1 is swept for tuning at a high speed so that the local oscillation signal frequency reaches a destined frequency or nearly equal frequency for the desired channel in a short time. Under this condition, the preset counter 7 produces an a count completion signal, as described above.

When the count completion signal is produced, a second switch control signal is applied to the switching circuit 21 so that the movable contact thereof is switched to the fixed contact B and the output of the detecting and producing circuit 20 is no longer applied to the second counter 14'. Thus, the count of the second counter 14' is incremented by the carry signal from the first counter 13 at a considerably lower rate than before. That is, like in the case of FIG. 4, the count of the second counter 14' is incremented by one for each count cycle of the first counter 13 and the tuning voltage and hence the local oscillation signal frequency changes slowly. This condition is shown in FIG. 8(iv) to (vii). Under this condition, the tuning voltage is changed with exactly the same speed and precision as those in FIG. 4. When the count completion signal is produced, it further enables the control circuit 22.

Since the gate circuit 19 has not yet been closed at this time, the content of the second counter 14' increments one by one and the tuning voltage and hence the local oscillation signal frequency rises. When the frequency goes beyond the destined frequency corresponding to the desired channel and reaches the frequency corresponding to the next channel, the wave shaping circuit 4 produces a pulse corresponding to the next channel. The control circuit 22 responds to this pulse to switch the second counter 14' into the down-counting operation mode.

As a result, each time the first counter 13 completes one cycle of counting operation, the count of the second counter 14' is now decremented. The operation of the RS flip-flop circuit 16 under this condition is shown in FIG. 8(vii) to (x). Accordingly, the tuning voltage and hence the local oscillation signal frequency falls slowly, and when the pulse corresponding to the desired channel is produced from the wave shaping circuit 4, the control circuit 22 closes the gate circuit 19 so that the count of the second counter 14' is maintained to the current count.

Accordingly, the Q-output of the RS flip-flop circuit 16 thereafter assumes the constant width square wave as shown in FIG. 8(x) to maintain the tuning voltage to the value necessary to select the desired channel. In this manner, the channel selection operation is completed.

Figure 9:
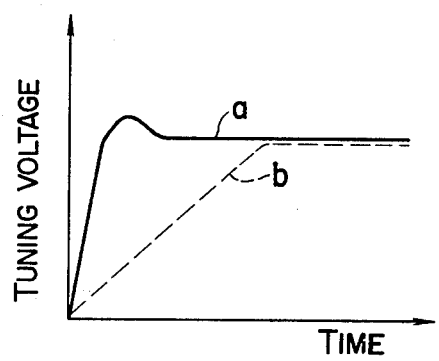

FIG. 9 shows the change of the tuning voltage under this condition, in which a solid curve a is for the embodiment of FIG. 7 and a broken curve b is for the circuit of FIG. 4.

According to the present embodiment, the tuning voltage or the local oscillation signal frequency begins to rise rapidly at a high change rate simultaneously with the start of the channel selection operation, and when it reaches the desired channel or near that channel, it changes slowly and finally it changes in the opposite direction and reaches the tuning voltage of the desired channel or the destined local oscillation signal frequency and it is maintained thereat.

Accordingly, in comparison with the example of FIG. 4, since the sweep precision near the tuning voltage for the desired channel is exactly same, the channel selection time can be considerably shortened without sacrificing the sweep precision of tuning. The above advantage is more remarkable when a larger channel number or higher tuning frequency of channel is to be selected.

While the first and second counters 13 and 14' in the illustrated embodiment are 12-bit counters, any n-bit counters (where n is a positive integer) may be used. Furthermore, while the detecting and producing circuit 20 has been shown to detect the lower 8 bits of the first counter 13, it may be designed to detect any lower k bits (where k is a positive integer, and n>k). The smaller the k is, the more coarse and the higher sweep is attained and the faster the local oscillation signal frequency can reach the destined frequency or nearly equal frequency for the desired channel.

Figure 10:
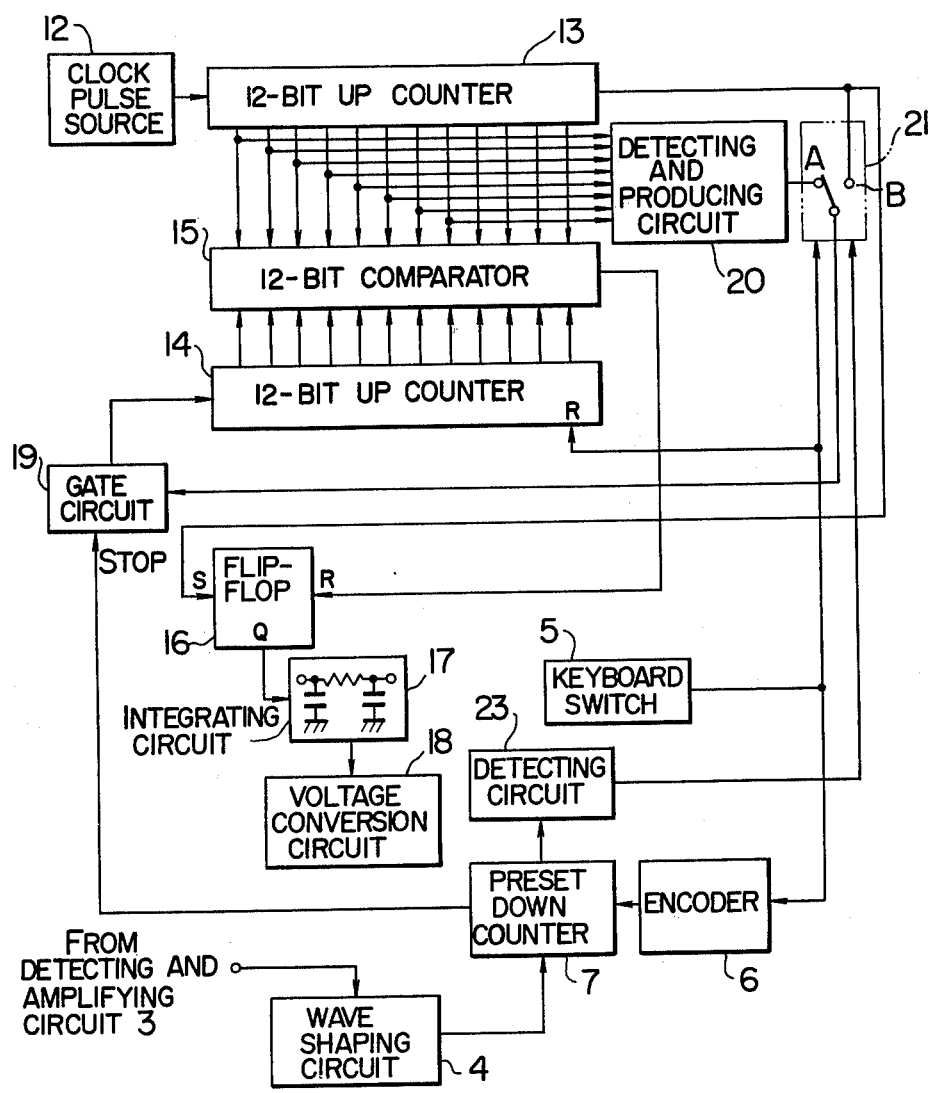
FIG. 10 is a block diagram showing another embodiment of the present invention.
Figure 11:
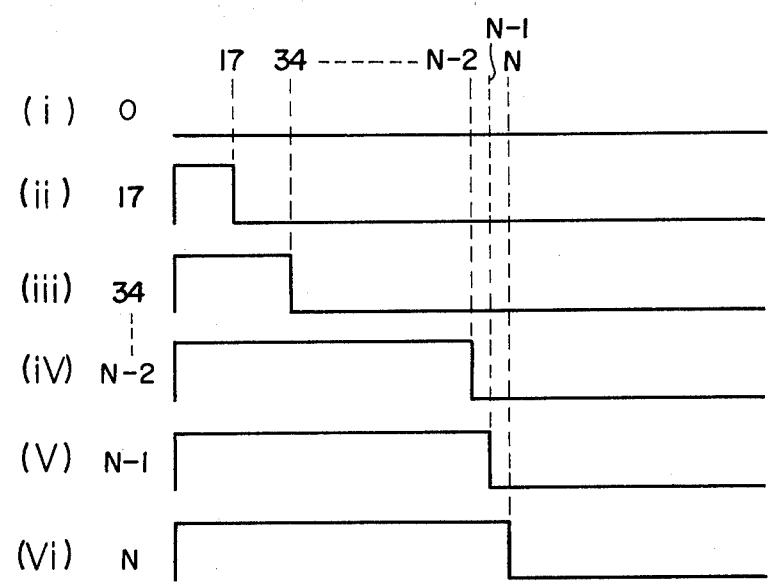
FIGS. 11 and 12 show charts useful to explain the operation of the channel selection apparatus of FIG. 10.

Referring now to FIGS. 10 and 11, another embodiment of the present invention is explained. In FIG. 10, the like numerals and symbols to those shown in FIGS. 4 and 7 designate like parts or components.

In the present embodiment, the channel selection apparatus comprises an electronic tuner 1 as shown in FIG. 1, a comb filter 2 as shown in FIG. 1, a detecting and amplifying circuit 3 as shown in FIG. 1, a wave shaping circuit 4, a preset down counter 7, and a local oscillation signal frequency sweeping means (corresponding to the tuning voltage sweep circuit 8 in FIG. 1) which includes the blocks 12 to 21, 23. The mutual arrangement and the functions of the circuits 1 to 7 may be similar to those of the embodiment of FIG. 7.

Numeral 23 denotes a circuit which is connected to the preset counter 7 to detect when the local oscillation signal frequency reaches a frequency corresponding to that channel which is one channel lower in frequency than the desired channel to produce a second switch control signal to be supplied to the switching circuit 21. Accordingly, when the switching circuit 21 receives the first switch control signal by the entry of the desired channel number by the keyboard switch 5, the movable contact makes contact with the fixed contact A and the output of the circuit 20 is transferred to the second 12-bit counter 14 through the gate circuit 19, and when the switching circuit 21 receives the second switch control signal from the detecting circuit 23, the movable contact makes contact with the fixed contact B so that a carry signal from the first 12-bit counter 13 is transferred to the second 12-bit counter 14 through the gate circuit 19. The gate circuit 19 is closed by a count completion signal from the preset counter 7. The other arrangement may be similar to the embodiment of FIG. 7.

The operation of the present embodiment is now explained. In FIG. 11, the numerals in the top line, i.e. 17, 34, ... N-2, N-1, N represent the count in the first 12-bit counter 13, and the numerals in the left column represent the count in the second 12-bit counter 14. When the channel number is entered by the keyboard switch 5, the second counter 14 is reset to zero and the gate circuit 19 is opened. In order to shorten the channel selection time, the contact A in the switching circuit 21 is closed to transfer the output signal of the detecting and producing circuit 20 to the second counter 14 through the gate circuit 19. The first counter 13 counts the first cycle from count 0 to count 4095, and when the bits at all of the bit terminals become zero, a carry signal is produced. Before the first cycle counting, the count of the second counter 14 is equal to zero. Accordingly, when the count of the first counter 13 is zero, the comparator 15 produces an identity signal which resets the RS flip-flop circuit 16. As a result, the Q-output of the RS flip-flop circuit 16 remains at the logical 0 level. This condition is shown in FIG. 11(i). When the first counter 13 completes the first counting cycle and the bits at all of the bit terminals become zero, a carry signal is produced, and the RS flip-flop circuit 16 is set thereby. By this time point, the count of the second counter 14 has reached count 17. In the next cycle, when the count of the first counter 13 reaches count 17, the comparator 15 produces an identity signal to reset the RS flip-flop circuit 16. Thus, the Q-output produces a waveform as shown in FIG. 11(ii). In the subsequent cycles, each time the first counter 13 completes one counting cycle, the count in the second counter 14 is incremented by 17 at a time. As a result, the count of the first counter 13 at which the RS flip-flop circuit 16 is reset increases by 17 at a time. Accordingly, the Q-output produces the waveforms as shown in FIG. 11(iii) . . . (iv).

Then, the switching circuit 21 is thrown to the contact B by the detecting circuit 23. As a result, the in the embodiment of FIG. 7, the sweep of the tuning voltage is switched to a low speed. This condition is shown in FIG. 11(iv) and (v). As shown in FIG. 11(vi), when the destined channel is reached, the preset counter 7 produces a count completion signal and the gate circuit 19 is closed. Thus, the tuning voltage is kept at a constant voltage and the channel selection operation is completed.

Figure 12:
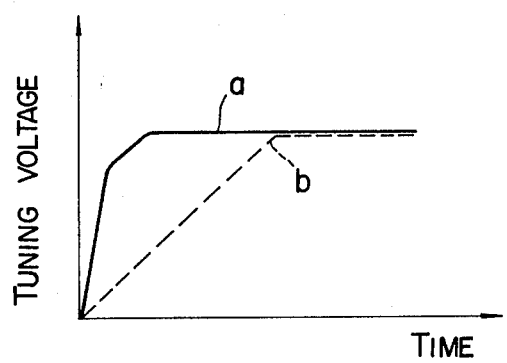

The change of the tuning voltage is shown in FIG. 12, in which a solid curve a is for the present embodiment and a broken curve b is for the circuit of FIG. 4.

In the present embodiment, when the first channel is to be selected, the sweep is carried out at a low rate immediately after the start of the channel selection. However, the selection time will not be long because the tuning voltage is soon reached and hence no practical problem is encountered.

In the present embodiment, while the sweeping operation is changed from a high speed mode to a low speed mode when that channel which is one channel lower in frequency than the destined channel is reached, it should be understood that it may be changed at any preceeding channel.

Figure 13:
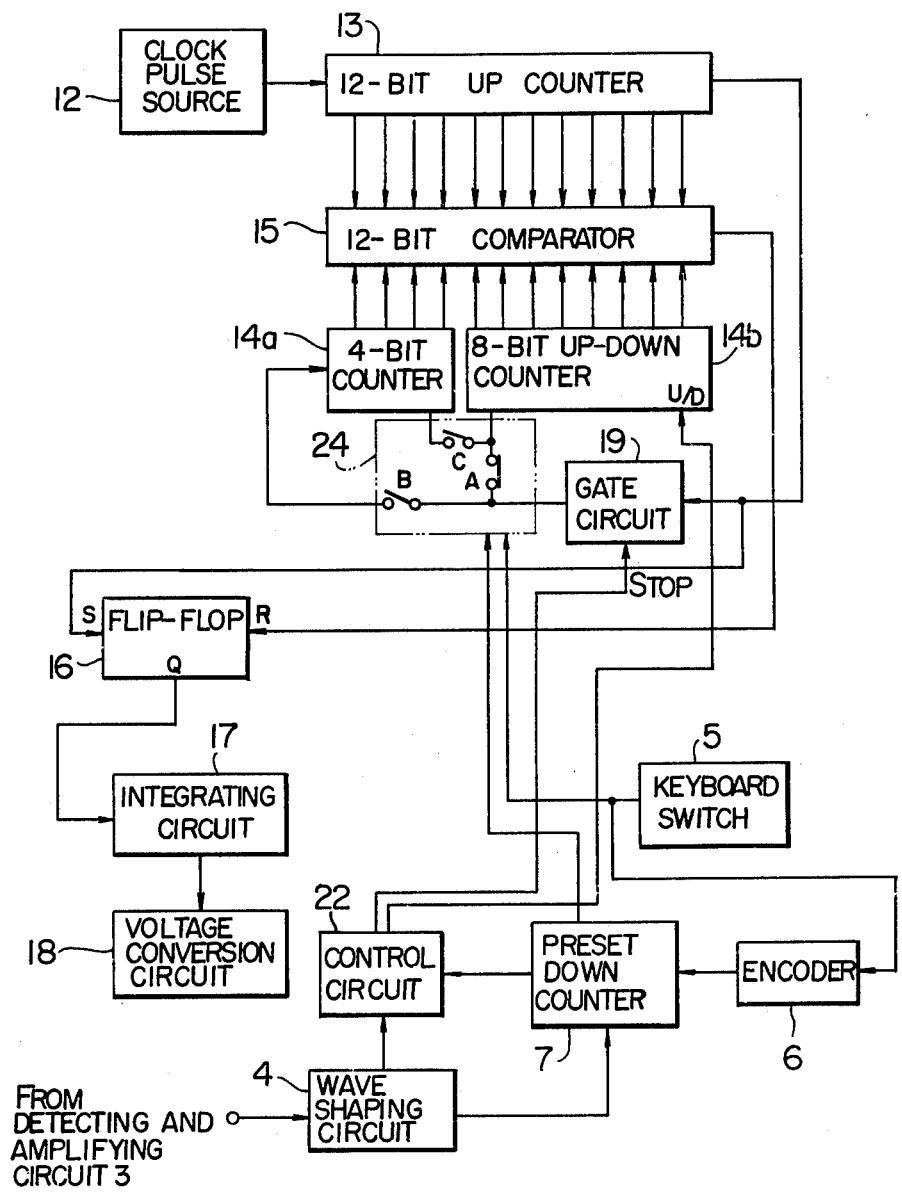
FIG. 13 shows a modification of the embodiment of FIG. 7.

FIG. 13 shows another embodiment of the present invention. In the present embodiment, the second 12-bit counter 14' in the embodiment of FIG. 7 is divided into two counter sections, and during the high speed sweeping mode, only one counter section relating to the higher order bits is used and during the low sopeed sweeping mode the both counter sections are used to increase the number of bits. Numerals 14a and 14b denote a 4-bit counter section and a 8-bit counter section, respectively, and the counter section 14b is an up-down counter.

Numeral 24 denotes a switching circuit which responds to a first switch control signal produced by the entry of a channel number by the keyboard switch 5 to close a contact A and open contacts B and C, and responds to a second switch control signal produced by a count completion signal from the preset counter 7 to open the contact A and close the contacts B and C. The other configuration is similar to the embodiment of FIg. 7. Reset circuits for the counter sections 14a and 14b are omitted in the drawing.

The operation of the present embodiment is briefly explained. During a high speed sweeping mode operation immediately after the start of the channel selection, the first counter 13 produces a carry signal each time it completes one counting cycle and this carry signal is applied only to the 8-bit counter section 14b through the contact A of the switching circuit 24 while the count of the counter section 14a is left zero.

As a result, each time the first counter 13 completes one counting cycle, the total count in the counter sections 14a and 14b increases by 16 at a time and the sweep is carried out at a high speed like in the case of FIG. 7. When the local oscillation signal frequency reaches a destined frequency or nearly equal frequency for the desired channel, the preset counter 7 produces a count completion signal to switch the switching circuit 24. Consequently, a carry signal from the first counter 13 is now applied to the counter section 14a through the contact B of the switching circuit 24, and the counter sections 14a and 14b are interconnected through the contact C so that they operate as one 12-bit counter. As a result, the count increases at a low speed and hence the sweeping operation is switched to a low speed mode. Thereafter, when the local oscillation signal frequency reaches the frequency corresponding to the next channel, the control circuit 22 switches the sweeping direction to the opposite direction so that the desired channel is swept back to complete the channel selection operation, like in the case of FIG. 7. Accordingly, the same effect as in the embodiment of FIG. 7 is attained by the present embodiment.

Figure 14:
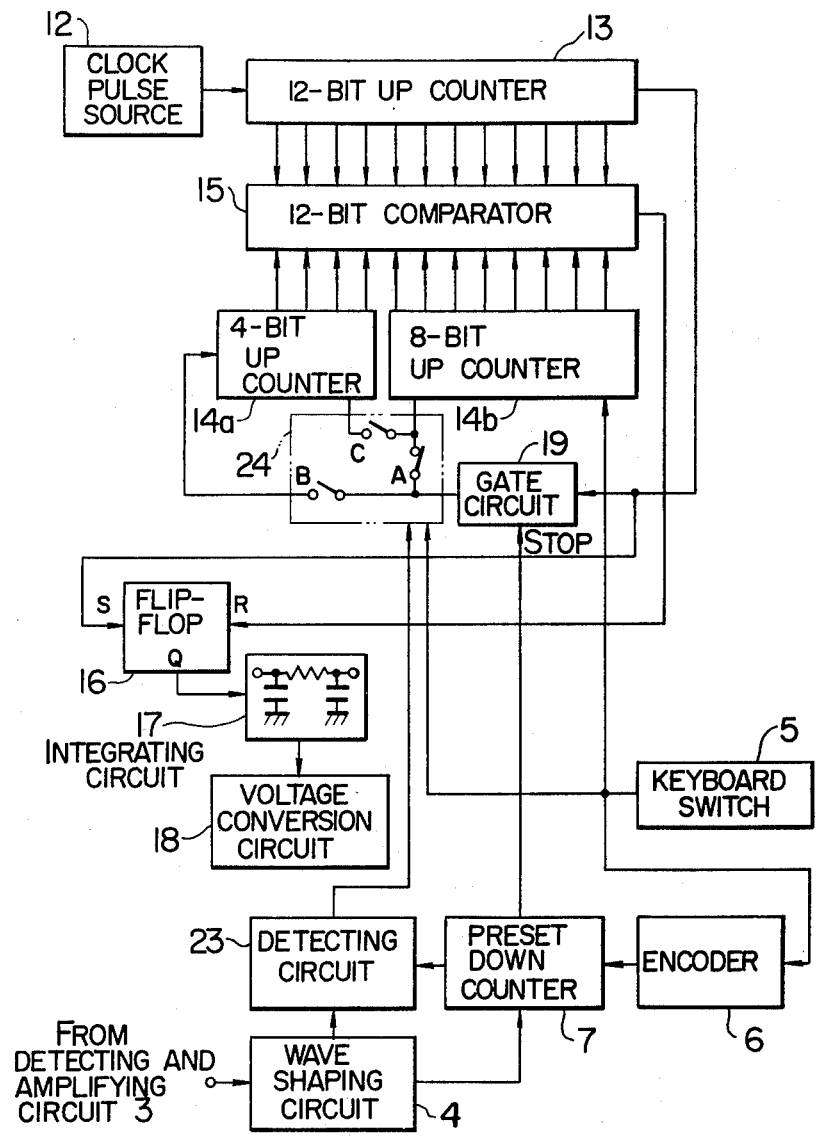
FIG. 14 shows a modification of the embodiment of FIG. 10.

In a modification shown in FIG. 14, the second 12-bit counter 14 shown in the embodiment of FIG. 10 is divided into two counter sections 14a and 14b, and during a high speed sweeping operation mode, only the 8-bit counter section 14b relating to the higher order bits is used and during a low speed sweeping operation mode the both counter sections 14a and 14b are used. The switching circuit 24 responds to a first switch control signal from the keyboard switch 5 to close the contact A and open the contacts B and C to transfer a carry signal from the first counter 13 to the counter section 14b through the gate circuit 19 (during the high speed sweeping operation mode) and also responds to a second switch control signal from the detecting circuit 23 to open the contact A and close the contacts B and C to transfer a carry signal from the first counter 13 to the counter section 14b through the gate circuit 19 (during the low speed sweeping operation mode). When the preset counter 7 produces the count completion signal, the gate circuit 19 is closed to complete the channel selection operation. Further detail of the operation will be apparent to those skilled in the art and hence it is omitted herein.

As explained above, according to the present invention, the channel selection can be effected in a very short time without sacrificing the tuning precision.

This will be further explained in conjunction with some examples. In an apparatus shown in FIGS. 1 and 4, approximately 8 seconds at maximum of channel selection time has been required when the clock frequency is 2 MHz, while the present apparatus requires one second or less of channel selection time using the same clock frequency while maintaining the same or higher tuning precision.

In FIG. 11 which illustrates the operation of the embodiments shown in FIGS. 10 and 14, curve a actually shows the change of the count of the second counter 14 or the counter sections 14a and 14b. Since the sweep control signal applied to the electronic tuner 1 is derived by converting the output waveform from the flip-flop circuit 16 to the voltage signal by the voltage conversion circuit 17 and integrating the converted signal by the integrating circuit 18 (the order of the circuits 17 and 18 may be reversed), a delay as shown by a curve $a_1$ in FIG. 15 may be introduced. The tuning voltage $V_d$ corresponding to the count of the second counter 14 is expressed by;

$$V_d = (h/4096)E \quad (4)$$

where h is the count of the second counter 14 and E is a reference voltage of the voltage conversion circuit 18.

Referring to FIG. 14, for example, as the tuning voltage rises, the channel count is counted in the preset counter 7. When it reaches the vicinity of the desired channel (e.g. one channel lower in frequency that the desired channel), the detecting circuit 23 produces a pulse which opens the contact A and closes the contacts B and C so that the count in the second counter (14a, 14b) is incremented by one for each completion of one counting cycle of the first counter 13. Thus, the Q-output of the RS flip-flop circuit 16 produces the waveforms as shown in FIG. 11(iv) to (vi). Therefore, the tuning voltage is swept at a high precision and low speed in the vicinity of the desired channel to be selected. This condition is shown by $B_1$ in FIG. 15. During the course of the low speed sweeping, a count completion signal is finally produced from the preset counter 7 and the gate circuit 19 is closed thereby so that the count in the second counter (14a and 14b) is fixed. As a result, the sweep of the tuning voltage is stopped at the desired channel.

Figure 15:
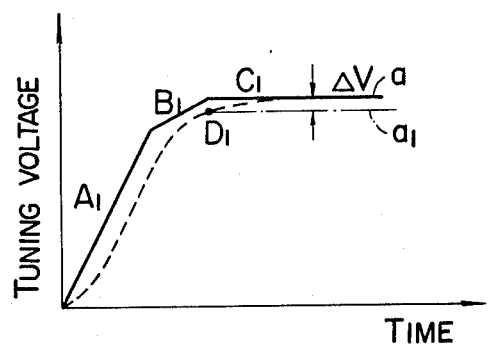
FIGS. 15 to 17 show charts useful to explain another aspect of the operation of the channel selection apparatus of FIG. 10 or FIG. 14.
Figure 16:
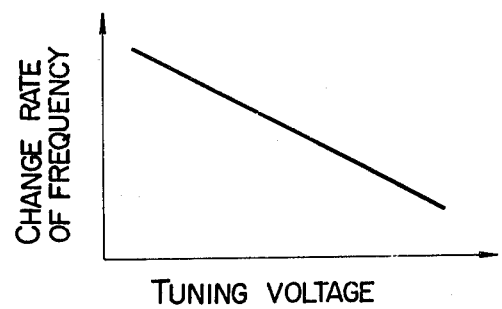
Figure 17:
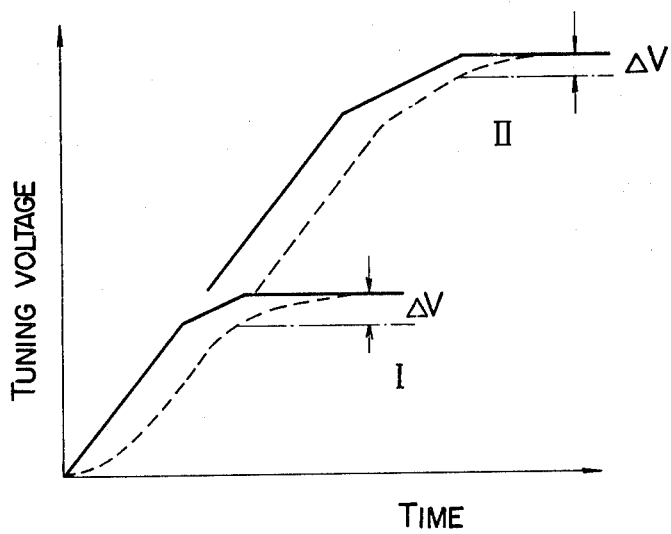

In this type of channel selection apparatus, however, it may happen that the count completion signal is produced when the actual output volage has a value shown by $D_1$ in FIG. 15. In this case, the amplitude of the sweep control voltage signal is smaller than $V_d$. Accordingly, even after the count completion signal has been produced, the actual tuning voltage rises by $\Delta V$ to coincide with $V_d$ as shown by $C_1$, and the excess sweeping corresponding to $\Delta V$ may occur. Furthermore, since beat may appear on the image if a ripple of the tuning voltage is large at the time of the stop of sweep, the integration constant or the time constant of the integrating circuit 18 must be large. As a result, the voltage $\Delta V$ which results in the excess sweeping is large. Especially for a UHF band, the excess sweeping is large enough to cover two or three broadcast stations. In order to eliminate the excess sweeping, it may be proposed to reduce the count of the second counter (14a and 14b) by the count corresponding to the excess sweeping voltage $\Delta V$ after a count completion signal has been produced. However, as shown in FIG. 16, the change of the local oscillation signal frequency per unit change of the tuning voltage is large for the low tuning voltage or low tuning frequency broadcast station and small for the high tuning voltage broadcast station. Therefore, for a given number of broadcast stations to be swept at a low speed, the excess sweeping voltage $\Delta V$ is large for the low tuning voltage broadcast station because the time period of the low speed sweeping is short and hence the count completion signal is produced before the delay in the high speed sweeping has not been fully compensated. This condition is shown by I in FIG. 17. Conversely, for the high tuning voltage broadcast station, since the time period of the low speed sweeping is long as shown by II in FIG. 17, the delay in the high speed sweeping is fully compensated and the saturation in the low speed sweeping is reached. As a result, the excess sweeping voltage $\Delta V$ is small. In this manner, the excess sweeping voltage changes depending on the tuning voltage.

According to one aspect of the present invention, the delay of the tuning voltage with respect to $V_d$ is reduced by reducing the time constant of the integrating circuit during the high speed sweeping of the tuning voltage. By increasing the time constant of the integrating circuit in the vicinity of the desired channel to effect the low speed sweeping, the delay is kept constant independently of the tuning voltage. When the sweep stop signal is produced, the tuning voltage may be further reduced by the amount corresponding to the delay.

Figure 19:
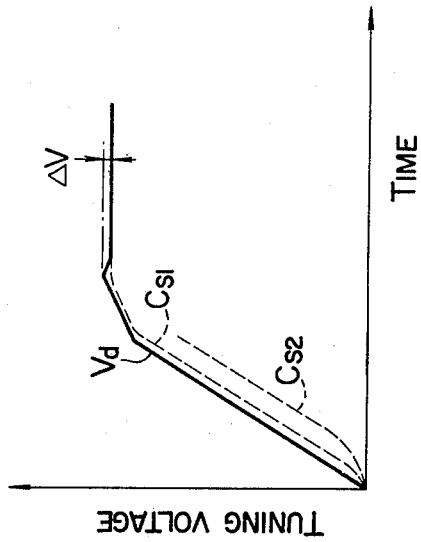
FIG. 19 shows an operational characteristic of the channel selection apparatus of FIG. 18.
Figure 18:
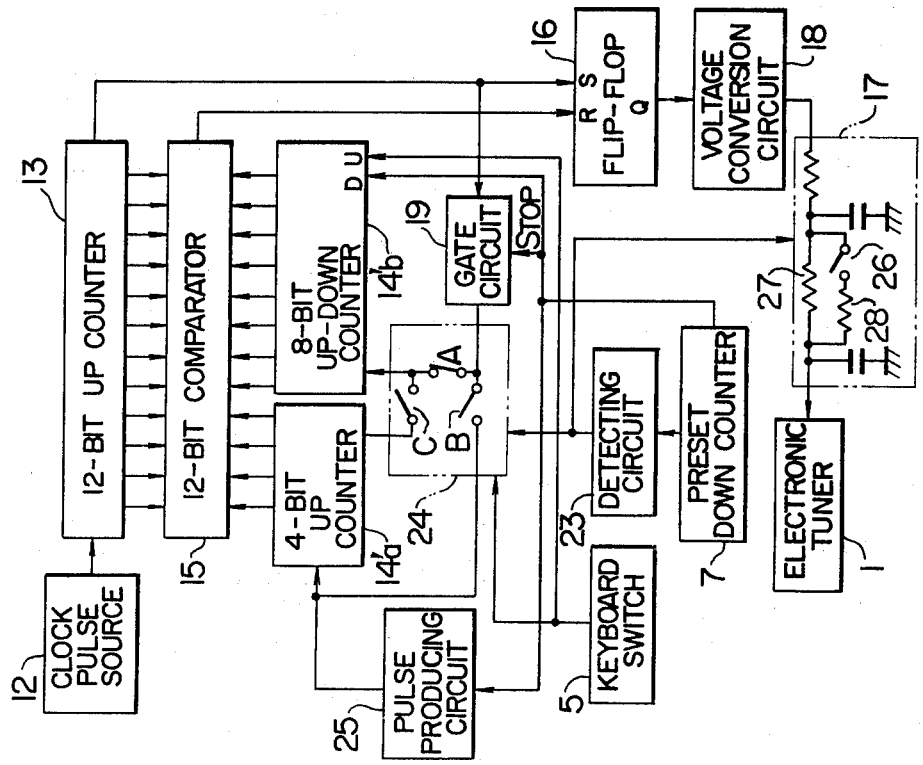
FIG. 18 is a block diagram showing another embodiment of the present invention.

Referring to FIGS. 18 and 19, another embodiment of the present invention is explained. In FIG. 18, the like numerals to those in FIG. 14 designate like parts. In the integrating circuit 17, numeral 26 denotes a switching element, numerals 27 and 28 denote resistors arranged to be connected in parallel through the switching element 26, and numeral 25 denotes a pulse producing circuit which responds to the occurrence of a count completion signal from the preset counter 7 to produce a predetermined number of pulses. Counter (14a' and 14b'!) is an up-down counter.

In the present embodiment, when the tuning voltage is to be swept at a high speed, the switch 26 is closed, and when it is to be swept at a low speed, the switch 26 is opened. Except for the above operation and the fact that the second counter is the up-down counter, the operation is exactly same as that of FIG. 14 to the time point when the count completion signal is produced. As the switch 26 is closed in the high speed sweeping mode, the time constant of the integrating circuit 17 is reduced so that the delay of the actual output voltage with respect to $V_d$ is small. As the tuning voltage rises, a low speed switching signal or the second switch control signal is produced from the detecting circuit 23 in the vicinity of the desired channel so that the tuning voltage is swept at a low speed and high precision at the same time, the switch 26 in the integrating circuit 17 is opened to increase the time constant to eliminate the ripple. Since a difference between the actual output voltage and $V_d$ is small at this time, the delay in the high speed sweeping can be fully compensated independently of the tuning voltage even if the number of the broadcast stations swept at a low speed is same as that in the case of FIG. 14. Therefore, the saturation in the low speed sweeping can be reached. Accordingly, the delay of voltage $\Delta V$ is constant independently of the tuning voltage. Thereafter, the preset counter 7 produces a count completion signal, which causes the gate circuit 19 to be closed and switches the second counter (14$a'$ and 14$b'$) to the down-counting operation mode and also causes the pulse producing circuit 25 to produce a predetermined number of (M) pulses to decrement the count by the amount corresponding to the delay voltage $\Delta V$. Consequently, the voltage of the sweep control signal from the integrating circuit 17 is maintained at the value assumed when the count completion signal is produced so that the excess sweeping is maintained. The predetermined number M of the pulses produced from the pulse producing circuit 25 may be selected to a closest integer to meet the following relation:

$$M = (4096 \cdot \Delta V)/E \tag{5}$$

The change of the tuning voltage under this condition is shown in FIG. 19, in which curve $C_{S2}$ shows the sweep control voltage for the embodiment of FIG. 10 or 14 and curve $C_{S1}$ is for the embodiment of FIG. 18.

As described hereinabove, the present embodiment provides a tuning voltage sweep circuit which can minimize the excess sweeping and stop the sweeping of the tuning voltage at an optimum tuning point. When it is applied to the television, the performance in VHF as well as UHF can be improved.

We claim:

1. A channel selection apparatus comprising:
an electronic tuner including a local oscillator for producing a local oscillation signal;
a comb filter for receiving said local oscillation signal and passing only those frequency components of said signal which lie within selected equi-spaced frequency ranges, the characteristics of said comb filter being such that a frequency band of a broadcast station corresponds to one of said equi-spaced frequency ranges;
means for detecting the output of said comb filter and generating at least one pulse in response thereto;
a preset down counter for counting the at least one pulse from said detecting means and producing a count completion signal when a preset count for said preset counter has been reached; and
means for sweeping the frequency of the local oscillation signal from said local oscillator, said local oscillation signal frequency sweeping means including means responsive to an actuation of the channel selection apparatus, for setting the rate of sweeping the local oscillation signal at a first rate, and responsive to said count completion signal from said preset down counter for setting said frequency sweeping rate at a second rate lower than the first rate, and means for producing a sweep control signal in response to the output of said means for setting the rate of sweeping the local oscillation signal frequency, said sweep control signal being fed to said electronic tuner.

2. A channel selection apparatus according to claim 1, in which said local oscillation signal frequency sweeping means further includes a clock pulse source, a first counter for counting pulses from said source, a gate circuit, a second counter arranged to receive a pulse signal from said first counter through said gate circuit, a comparator for comparing the contents of said first and second counters and producing an identity signal when said contents are identical, and a flip-flop circuit arranged to be set by a carry signal from said first counter and reset by said identity signal from said comparator, the output of said flip-flop circuit being fed to said sweep control signal producing means.

3. A channel selection apparatus according to claim 2, in which: said first counter is an n-bit up counter; said second counter is an n-bit up-down counter arranged to operate in its up-counting operation mode from the beginning of the actuation of the channel selection apparatus; and said means for setting the rate of sweeping the local oscillation signal frequency includes means for producing a pulse each time it detects the fact that k succeeding bits taken from the least significant bit of said first counter are all in binary "0" state, where positive interger n is larger than positive interger k, a control circuit serving to switch the operation mode of said second counter from its up-counting operation mode to its down-counting operation mode in response to a pulse produced by said detecting and generating means with said local oscillation signal frequency having been increased to a higher frequency in a higher frequency range next to a frequency range in which a destined frequency exists and a switching circuit for transferring the output of said pulse producing means to said second counter through said gate circuit in response to a first switch control signal produced at the actuation of the channel selection apparatus with said local oscillation signal frequency being lower than said destined frequency and for transferring a carry signal from said first counter to said second counter through said gate circuit in response to a second switch control signal produced from said count completion signal from said preset counter with said local oscillation signal frequency being higher than said destined frequency, said control circuit also serving to close said gate circuit in response to another pulse produced by said detecting and generating means with said local oscillation signal frequency having been decreased from said higher frequency to said destined frequency.

4. A channel selection apparatus according to claim 2, in which: said first and second counters are n-bit up counters; and said means for setting the rate of sweeping the local oscillation signal frequency includes means for producing a pulse each time it detects the fact that k succeeding bits taken from the least significant bit of said first counter are all in binary "0" state, where positive interger n is larger than positive interger k, a detecting circuit connected with said preset counter for producing a second switch control signal with said local oscillation signal frequency having reached a lower frequency in a lower frequency range next to a frequency range in which a destined frequency exists and a switching circuit for transferring the output of said pulse producing means to said counter through said gate circuit in response to a first switch control signal produced at the actuation of the channel selection apparatus with said local oscillation signal frequency being lower than said lower frequency and for transferring a carry signal from said first counter to said second counter through said gate circuit in response to said second switch control signal from said detecting circuit connected with said preset counter with said local oscillation signal frequency being between said lower frequency and said destined frequency, said gate circuit being arranged to be closed by said count completion signal from said preset counter.

5. A channel selecting device according to claim 2, in which: said first counter is an n-bit up counter; said second counter is an n-bit up-down counter comprising an (n−k)-bit counter section and a k-bit counter section capable of being combined into said n-bit up-down counter, where positive interger n is larger than positive interger k, bits concerning said (n−k)-bit counter section being less significant than those concerning said k-bit counter section, said second counter being arranged to operate in its up-counting operation mode from the beginning of the actuation of the channel selection apparatus; and said means for setting the rate of sweeping the local oscillation signal frequency includes a control circuit serving to switch the operation mode of said second counter from its up-counting operation mode to its down-counting operation mode in response to a pulse produced by said detecting and generating means with said local oscillation signal frequency having been increased to a higher frequency in a higher frequency range next to a frequency range in which a destined frequency exists, a switching circuit for interconnecting said gate circuit, said (n−k)-bit counter section and said k-bit counter section, said switching circuit disconnecting said k-bit counter section from said (n−k)-bit counter section and transferring a carry signal from said first counter only to said k-bit counter section through said gate circuit in response to a first switch control signal produced at the actuation of the channel selection apparatus with said local oscillation signal frequency being lower than said destined frequency, said switching circuit combining said (n−k)-bit counter section and said k-bit counter section into said second counter and transferring a carry signal from said first counter to said (n−k)-bit counter section through said gate circuit in response to a second switch control signal produced from said count completion signal from said preset counter with said local oscillation signal frequency being higher than said destined frequency, said control circuit also serving to close said gate circuit in response to another pulse produced by said detecting and generating means with said local oscillation signal frequency having been decreased from said higher frequency to said destined frequency.

6. A channel selection apparatus according to claim 2, in which: said first counter is an n-bit up counter; said second counter is an n-bit up counter comprising an (n−k)-bit counter section and a k-bit counter section capable of being combined into said n-bit up counter, where positive interger n is larger than positive interger k, bits concerning said (n−k)-bit counter section being less significant than those concerning said k-bit counter section; and said means for setting the rate of sweeping the local oscillation signal frequency includes a detecting circuit connected with said preset counter for producing a second switch control signal with said local oscillation signal frequency having reached a lower frequency in a lower frequency range next to a frequency range in which a destined frequency exists and a switching circuit for interconnecting said gate circuit, said (n−k)-bit counter section and said k-bit counter section, said switching circuit disconnecting said k-bit counter section from said (n−k)-bit counter section and transferring a carry signal from said first counter only to said k-bit counter section through said gate circuit in response to a first switch control signal produced at the actuation of the channel selection apparatus with said local oscillation signal frequency being lower than said destined frequency, said switching circuit combining said (n−k)-bit counter section and said k-bit counter section into said second counter and transferring a carry signal from said first counter to said (n−k)-bit counter section through said gate circuit in response to said second switch control signal from said detecting circuit connected with said preset counter with said local oscillation signal frequency being between said lower frequency and said destined frequency, said gate circuit being arranged to be closed by said count completion signal from said preset counter.

7. A channel selection apparatus according to claim 3, 4, 5 or 6, in which n is 12 and k is 8.

8. A channel selection apparatus according to claim 1, in which: said sweep control signal producing means includes an integrating circuit; and said local oscillation signal frequency sweeping means further includes a clock pulse source, a first counter for counting pulses from said source, a gate circuit, a second counter arranged to receive a pulse signal from said first counter through said gate circuit, said second counter being capable of up-counting and down-counting, a comparator for comparing the contents of said first and second counters and producing an identity signal when said contents are identical, and a flip-flop circuit arranged to be set by a carry signal from said first counter and reset by said identity signal from said comparator, the output of said flip-flop circuit being fed to said sweep control signal producing means.

9. A channel selection apparatus according to claim 8, in which the apparatus further comprises means for producing a predetermined number of pulses to be fed to said second counter in response to said count completion signal from said preset counter, said second counter being arranged to operate in its up-counting operation mode from the actuation of the channel selection apparatus and switched into its down-counting operation mode by said count completion signal from said preset counter, said gate circuit being closed by said count completion signal.

10. A channel selection apparatus according to claim 8, in which the apparatus further comprises: means responsive to said count completion signal from said preset counter for decreasing the time constant of said integrating circuit; and means for producing a predetermined number of pulses to be fed to said second counter in response to said count completion signal from said preset counter; said second counter being arranged to operate in its up-counting operation mode from the actuation of the channel selecting device and switched into its down-counting operation mode by said count completion signal from said preset counter, said gate circuit being closed by said count completion signal.

11. A channel selection apparatus according to claim 10, in which: said first counter is an n-bit up-counter and said second counter is an n-bit up-down counter; said integrating circuit includes a resistive component; said means for setting the rate of sweeping the local oscillation signal frequency includes means for producing a pulse each time it detects the fack that k succeeding bits taken from the least significant bit of said first counter are all in binary "0" state, where positive interger n is larger than positive interger k, a detedting circuit connected with said preset counter for producing a second switch control signal with said local oscillation signal frequency having reached a lower frequency in a lower frequency range next to a frequency range in which a destined frequency exists and a switching circuit for transferring the output of said pulse producing means to said second counter through said gate circuit in response to a first switch control signal produced at the actuation of the channel selection apparatus with said local oscillation signal frequency being lower than said lower frequency and for transferring a carry signal from said first counter to said second counter through said gate circuit in response to said second switch control signal from said detecting circuit connected with said preset counter with said local oscillation signal frequency being between said lower frequency and said destined frequency, said gate circuit being arranged to be closed by said count completion signal from said preset counter; sand said time constant decreasing means includes a switching element and a resistor connectable in parallel with the resistive component of said integrating circuit through said switching element, said switching element being arranged to be conductive by said second switch control signal from said detecting circuit connected with said preset counter.

12. A channel selecting device according to claim 10, in which: said integrating circuit includes a resistive component; said first counter is an n-bit up-counter; said second counter is an n-bit up-down counter comprising an $(n-k)$-bit counter section and a k-bit counter section capable of being combined into said up-down counter, where positive integer n is larger than positive integer k, bits concerning said $(n-k)$-bit counter section being less significant than those concerning said k-bit counter section; said means for setting the rate of sweeping the local oscillation signal frequency includes a detecting circuit connected with said preset counter for producing a second switch control signal with said local oscillation signal frequency having reached a lower frequency in a lower frequency range next to a frequency range in which a destined frequency exists and a switching circuit for interconnecting said gate circuit, said $(n-k)$-bit counter section and said k-bit counter section, said switching circuit disconnecting said k-bit counter section from said $(n-k)$-bit counter section and transferring a carry signal from said first counter only to said k-bit counter section through said gate circuit in response to a first switch control signal produced at the actuation of the channel selection apparatus with said local oscillation signal frequency being lower than said destined frequency, said switching circuit combining said $(n-k)$-bit counter section and said k-bit counter section into said second counter and transferring a carry signal from said first counter to said $(n-k)$-bit counter section through said gate circuit in response to said second switch control signal from said detecting circuit connected with said preset counter with said local oscillation signal frequency being between said lower frequency and said destined frequency, said gate circuit being arranged to be closed by said count completion signal from said preset counter; and said time constant decreasing means includes a switching element and a resistor connectable in parallel with the resistive component of said integrating circuit through said switching element, said switching element being arranged to be conductive by said second switch control signal from said detecting circuit connected with said preset counter.

* * * * *